United States Patent

Hsia et al.

[11] Patent Number: 5,827,780
[45] Date of Patent: Oct. 27, 1998

[54] ADDITIVE METALIZATION USING PHOTOSENSITIVE POLYMER AS RIE MASK AND PART OF COMPOSITE INSULATOR

[76] Inventors: Liang Choo Hsia, 13th Floor, #9, Lane 30, Cheng Kung Road, Section 4, Taipei, Taiwan; Thomas Tong Long Chang, 3474 Bonita Ave., Santa Clara, Calif. 95051

[21] Appl. No.: 626,111
[22] Filed: Apr. 1, 1996
[51] Int. Cl.$^6$ .............................. H01L 21/465; G03C 5/00
[52] U.S. Cl. ...................... 438/692; 438/703; 438/712; 438/725; 438/763; 438/778; 438/780; 430/313; 430/318
[58] Field of Search .......................... 156/625.1, 643.1, 156/645.1; 437/228, 245; 430/313, 318; 438/692, 703, 712, 725, 763, 778, 780

[56] References Cited

U.S. PATENT DOCUMENTS

| | | | |
|---|---|---|---|
| 4,758,306 | 7/1988 | Cronin et al. | 156/643 |
| 5,244,534 | 9/1993 | Yu et al. | 156/636 |
| 5,246,885 | 9/1993 | Braren et al. | 437/225 |

*Primary Examiner*—Mark Chapman
*Attorney, Agent, or Firm*—H. C. Lin, Patent Agent

[57] ABSTRACT

The surface of an integrated circuit, which uses reactive ion etching to pattern metal interconnection, is protected with two insulating layers on the surface. The first layer is a conventional silicon dioxide. The second layer is a photosensitive polymer which is the same as the material used for subsequent metalization of interconnection using the reactive ion etching technique. When the second layer is used, the reactive ion etching cannot attack the silicon dioxide. A trench can be cut through the two insulating layers, using a window in the photosensitive polymer as a mask, to serve as a via hole for metal to contact the substrate

16 Claims, 1 Drawing Sheet

ADDITIVE METALIZATION USING PHOTOSENSITIVE POLYMER AS RIE MASK AND PART OF COMPOSITE INSULATOR

BACKGROUND OF THE INVENTION

This invention relates to surface protection of integrated circuit (IC), where reactive ion etching technique is used for the metalization of interconnection.

In an IC, metal interconnections are used to interconnect the different devices for circuit functions. The metal is first deposited over the entire surface of a silicon wafer covered with an insulating layer such as silicon dioxide, and then patterned with a mask to form the interconnection. It is important that the insulating layer be free from pin holes to preserve its integrity. Otherwise the pin holes may cause unwanted short circuit between the metal and the underlying circuit elements.

An effective method for patterning or etching the metal is reactive ion etching (RIE). Photosensitive polymer has been used as a mask for RIE. The patterned polymer is then used as a RIE mask to etch the metal outside the interconnection. During the RIE process, the insulating layer outside the interconnection area is subjected to RIE, and the integrity of the insulating layers may be affected.

Another important consideration in the fabrication of submicron integrated circuits is planarity. With dimensions below 0.35 $\mu$m and with increased number of metal layers in very large scale integration (VLSI), the depth of focus (<1 $\mu$m) of high numerical aperture lenses used in the latest generation wafers steppers and the metal thinning that can occur over steep topographies become very serious problems. The yield and reliability can be adversely affected. Chemical-mechanical polishing (CMP) has recently been advocated to planarize the surfaces of high density integrated circuits. It has been implemented to fabricate multiple dielectrically isolated metal layers. In the CMP process, a microabrasive material is applied and rubbed by a specialized polishing pad, which uniformly removes the top surface of films that have been deposited on the wafer. The process has been found to provide flatness two orders of magnitude better than any previously available technology.

There are, however, several issues affecting adoption of CMP. An overriding difficulty is wafer throughput. Ideally, the process would involve a single-pass system capable of reliable production runs. Lack of an endpoint system for measuring oxide film thickness during polishing is another problem. Contamination is still another issue. It has also proven difficult to efficiently transfer CMP developmental results to production levels.

As a result, while it is desirable to planarize the wafer surfaces, the process tends to weaken the underlying oxide. Any attempt in planarization should not sacrifice the integrity of the insulating layers.

SUMMARY OF THE INVENTION

An object of this invention is to preserve the integrity of the insulating layer covering an integrated circuit with metal subjected to reactive ion etching. Another object of this invention is to construct a trench as a via hole for metal contact to the integrated circuit. Still another object of this invention is to construct a planarized surface for the integrated circuit.

These objects are achieved by using a composite layer of silicon dioxide and photosensitive polymer as insulator for an integrated circuit. During the subsequent metalization process, the silicon dioxide is protected from the reactive ions by the photosensitive polymer. A trench is cut through the composite layer to serve as a via-hole for metal contact.

DETAILED DESCRIPTION OF THE PREFERRED EMBODIMENT

Figure 1:
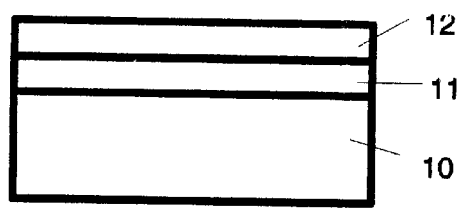
FIG. 1 shows the cross-section of an integrated circuit with a composite layer of silicon dioxide $SiO_2$ and photosensitive polymer.
Figure 2:
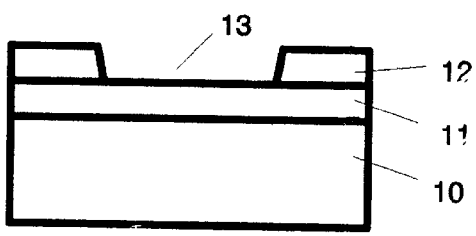
FIG. 2 shows the cross-section after the photosensitive polymer has been patterned.
Figure 3:
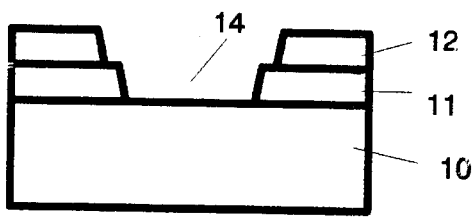
FIG. 3 shows the cross-section after the $SiO_2$ has been etched.
Figure 4:
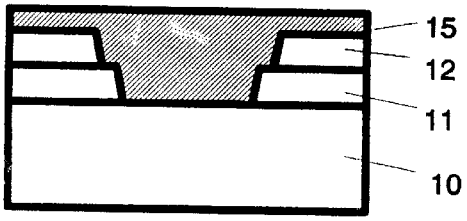
FIG. 4 shows the cross-section after metal deposition.

In an integrated circuit, a silicon substrate is used to fabricate a large number of transistors and other components. These transistors and other components are then interconnected with metal to complete the circuit. Before the metal is deposited over the silicon substrate for patterning interconnection, the silicon substrate is covered with layer of insulator (usually $SiO_2$) to provide insulation and protection of the silicon surface.

In recent years, the patterning of the metal interconnection is often performed with reactive ion etching (RIE) and CMP, because it yields high resolution. In the RIE process, the metal interconnection is protected with a photoresistive mask, and the unmasked metal is etched with reactive ions. In so doing, the reactive ion may attack the $SiO_2$ under the removed metal, causing pin holes.

In this invention, a composite layer of $SiO_2$ and photosensitive polymer is used as the insulating layer for covering an integrated circuit and for supporting the metal interconnection. The steps for fabricating this structure are shown from FIG. 1 to FIG. 5.

Step 1 (FIG. 1): Coat a layer of photosensitive polymer 12, preferably polyimide, on top of silicon oxide $SiO_2$ 11 or any other dielectric material, such as silicon nitride, which covers a silicon substrate 10. The polymer thickness is 1 $\mu$m to several microns. A composite insulating layer is formed.

Step 2 (FIG. 2): Pattern the photosensitive polyimide 12 using a mask. After exposure and development, a window 13 is opened in the polyimide 12. The polymer 12 is cured to certain temperature to increase its hardness and RIE resistance.

Step 3 (FIG. 3): Use the patterned polymer with window 13 as a mask to reactively etch the underlying silicon oxide to form a trench 14 in the composite insulating layer of $SiO_2$ 11 and polymer 12. At this point, it may be desirable to further cure the polyimide.

Step 4 (FIG. 4): Deposit the desirable metal 15 by sputtering or chemical vapor deposition process. The metal can be copper, aluminum, or tungsten, depending on application. The metal should completely fill the silicon and polyimide trenches 14.

Figure 5:
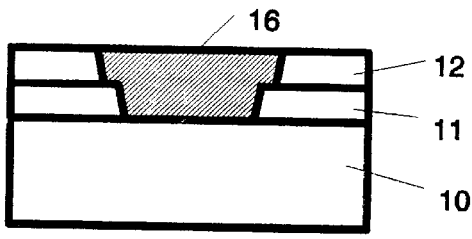
FIG. 5 shows the cross-section after the unwanted excess metal has been removed with RIE or CMP.

Step 5 (FIG. 5): Use chemical-mechanical polishing (CMP) technique to remove excessive metal and to accomplish planarization as shown in FIG. 5 with the metal 16 entrenched. Planarization of silicon wafters at this step has become more attractive with the decrease in photolithography line widths and the subsequent decrease in depth of focus at lithography. At this point it is also possible to remove a part of polyimide, if it is so desired, by either the application or the process.

At this stage, a structure with composite insulating layer, metal via trenches and planar surface is obtained. Later, when metal interconnection is to be processed with RIE technique, the surface where excess metal should be removed is protected from the reactive ion etch and the integrity of the $SiO_2$ insulator is preserved.

It can be seen that with this structure and fabricating method, all the objects of this invention have been achieved, namely: the integrity of the insulating layers, planarity of the structure, and the provision of via holes.

While the foregoing embodiment specifies the use of $SiO_2$ in the composite layer, it should be pointed out that the insulator is not limited to $SiO_2$. Any suitable insulating dielectric, such as silicon nitride, may be used, and is all within the scope of this invention.

What is claimed is:

1. An integrated circuit structure, comprising:

a semiconductor substrate fabricated with various active and passive devices, an insulating layer covering said structure having a composite of a dielectric is lower layer and a photosensitive polymer as upper layer for protecting the integrity of said dielectric from any subsequent reactive ion etching and metal interconnection which is patterned by removing any excess metal deposited on top of said insulating layer with said reactive ion etching using said photosensitive polymer as a mask.

2. An integrated circuit structure as described in claim 1, wherein said semiconductor substrate is a silicon substrate, and said dielectric is silicon dioxide.

3. An integrated circuit structure as described in claim 1, wherein said substrate is a silicon substrate and said dielectric is silicon nitride.

4. An integrated circuit structure as described in claim 1, wherein said photosensitive polymer is polyimide.

5. An integrated circuit structure as described in claim 1, wherein a trench is cut in said insulating layer as a via hole for a metal contact to said semiconductor substrate.

6. An integrated circuit as described in claim 5, wherein said trench is filled with metal.

7. An integrated circuit as described in claim 6, wherein said metal is selected from the group consisting of copper, aluminum and tungsten.

8. An integrated circuit as described in claim 1, wherein said metal interconnection is planarized by chemical-mechanical process.

9. A method of fabricating an integrated circuit having a semiconductor substrate covered with a first insulating layer, comprising the steps of:

coating over said first insulating layer a second insulating layer of photosensitive polymer, which is resistant to reactive ion etching when cured, patterning said photosensitive polymer using a mask, curing said photosensitive polymer, etching said first insulating layer using said photosensitive polymer as a mask to form a trench, without removing said photosensitive polymer, depositing a metal to form said trench to form a contact with said substrate, removing any excess metal deposited said trench and planarizing the surface of said photosensitive polymer, and metalizing said surface for interconnection and patterning said interconnection with said reactive ion etching without affecting the integrity of said first insulating layer with protection from said photosensitive polymer.

10. A method of fabricating an integrated circuit as described in claim 9, wherein said substrate is silicon and said first insulating layer is silicon dioxide.

11. A method of fabricating an integrated circuit as described in claim 9, wherein said substrate is silicon and said first insulating layer is silicon nitride.

12. A method of fabricating an integrated circuit as described in claim 9, wherein said photosensitive polymer is polyimide.

13. A method of fabricating an integrated circuit as described in claim 9, wherein said metal is deposited by sputtering.

14. A method of fabricating an integrated circuit as described in claim 9, wherein said metal is deposited by chemical vapor deposition.

15. A method of fabricating an integrated circuit as described in claim 9, wherein said metal is selected from a group consisting of copper, aluminum and tungsten.

16. A method of fabricating an integrated circuit as described in claim 9, wherein said excess metal is removed by chemical-mechanical polishing technique.

* * * * *